(12) United States Patent
Takeshima et al.

(10) Patent No.: US 6,816,047 B2
(45) Date of Patent: Nov. 9, 2004

(54) MAGNETIC RESONANCE IMAGING APPARATUS

(75) Inventors: Hirotaka Takeshima, Tokyo (JP); Hajime Kawano, Tokyo (JP); Shigeru Kakugawa, Ibaraki-ken (JP); Noriaki Hino, Ibaraki-ken (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 10/391,284

(22) Filed: Mar. 18, 2003

(65) Prior Publication Data

US 2003/0155998 A1 Aug. 21, 2003

Related U.S. Application Data

(62) Division of application No. 08/895,269, filed on Jul. 16, 1997, which is a continuation of application No. PCT/JP96/03512, filed on Nov. 29, 1996.

(30) Foreign Application Priority Data

Nov. 30, 1995 (JP) .............................................. 7-336023

(51) Int. Cl.[7] .................................................. H01F 6/00
(52) U.S. Cl. ........................ 335/216; 335/299; 335/301; 324/319; 324/320
(58) Field of Search ................................ 335/216, 299, 335/301; 324/318, 319, 320

(56) References Cited

U.S. PATENT DOCUMENTS

| | | | |
|---|---|---|---|
| 4,766,378 A | 8/1988 | Danby et al. | |
| 4,829,252 A | * 5/1989 | Kaufman | ..................... 324/309 |
| 5,194,810 A | 3/1993 | Breneman et al. | |
| 5,382,904 A | 1/1995 | Pissanetzky | |
| 5,410,287 A | 4/1995 | Laskaris et al. | ............ 324/318 |
| 5,448,214 A | 9/1995 | Laskaris | |
| 5,565,831 A | * 10/1996 | Dorri et al. | .................. 335/216 |

FOREIGN PATENT DOCUMENTS

| | | |
|---|---|---|
| GB | 2 289 343 A | 11/1995 |
| JP | 60142506 | 7/1985 |
| JP | 61125109 | 12/1986 |

* cited by examiner

Primary Examiner—Ramon M. Barrera
(74) Attorney, Agent, or Firm—Lawrence E. Laubscher, Jr.

(57) ABSTRACT

The present invention relates to techniques for enlarging an opening, which accommodates a subject, in a superconducting magnet apparatus for use in MRI system, so as to prevent the subject from feeling claustrophobic, and for realizing low magnetic field leakage therefrom, and for reducing the weight thereof, and for realizing a large high magnetic field strength uniform magnetic field region.

Static magnetic field generating sources of the superconducting magnet apparatus are constituted by two sets of superconducting coils, the respective sets of which are placed in such a manner as to face each other across a uniform magnetic field generating region. Each of the sets of superconducting coils consists of a main coil for feeding electric current in a specific direction, a bucking coil for feeding electric current in a direction opposite to the direction of the electric current flow passing through the main coil, and a coil for correcting magnetic homogeneity. The diameter of the aforementioned main coil is set as being nearly equal to that of the aforesaid bucking coil. Further, the diameter of the coil for correcting the magnetic homogeneity is set as being less than that of the main coil. Moreover, an amount of electric current flowing through the coil for correcting the magnetic homogeneity is set as being less than that of electric current passing through the main coil. Furthermore, the distance between the two main coils facing each other is set as being shorter than that between the two bucking coils.

3 Claims, 9 Drawing Sheets

MAGNETIC RESONANCE IMAGING APPARATUS

This application is a division of U.S. patent application Ser. No. 08/895,269 filed Jul. 16, 1997 which was a continuation of PCT/JP96/03512 filed Nov. 29, 1996.

TECHNICAL FIELD

The present invention relates to a superconducting magnet apparatus that is suitable for use in a magnetic resonance imaging system (hereunder referred to as "MRI system") and, more particularly, to a superconducting magnet apparatus that has a large opening to thereby prevent a subject from feeling claustrophobic and to thereby allow an operator to have easy access to a subject.

BACKGROUND ART

FIG. 7 illustrates an example of a conventional superconducting magnet apparatus for use in MRI system. This example is a superconducting magnet apparatus of the horizontal magnetic field type. This superconducting magnet apparatus is composed of small-diameter main coils 13, 14, 15, 16, 17 and 18 and large-diameter shield coils 19 and 20 and is adapted to produce a horizontal (namely, Z-axis direction) magnetic field. In this example, the main coils 13 to 18 are placed to produce a magnetic field along the center axis 22 of a magnet, while the shield coils 19 and 20 are placed to shield magnetic field leakage to the surroundings thereof. With such a configuration of the magnet, a uniform magnetic field region 21 of magnetic homogeneity of about 10 ppm or less is formed in a magnetic field space. Magnetic resonance imaging pictures are taken in this uniform magnetic filed 21.

These coils are generally made by using superconducting wires, and thus need cooling to a predetermined temperature (for example, liquid-helium temperature (namely, 4.2 K) in the case of alloy superconductors; and liquid-nitrogen temperature (namely, 77 K) in the case of oxide superconductors). The coils are, therefore, held in a cooling vessel consisting of a vacuum enclosure, a thermal shield and a coolant container (containing liquid helium or the like). In the case of the example of FIG. 7, the main coils 13 to 18 and the shield coils 19 and 20 are placed in a coolant container 11, which contains coolant 12, such as liquid helium, for superconductivity by supported by means of supporting elements (not shown). Further, the coolant container 11 is held in a vacuum enclosure 10.

Moreover, to hold each of the coils at a low temperature, the thermal shield is maintained at a constant temperature by using a refrigerator (not shown) or the evaporation of coolant 12 for superconductivity is reduced. Recently, the performance of the refrigerator has been increased, so that the superconductor coils are sometimes cooled directly by the refrigerator without using the coolant container 11.

However, in the case of the superconducting magnet apparatus illustrated in FIG. 7, an opening, in which a subject is accommodated and images of the subject are taken, is narrow and moreover, a measuring space is surrounded, so that subjects sometimes feel claustrophobic. Thus, occasionally, subjects refuse to enter the opening of the apparatus for examination. Furthermore, it is difficult for an operator to get access to a subject from outside the superconducting magnet apparatus.

FIG. 8 illustrates another example of a conventional superconducting magnet apparatus for use in MRI system. This example is an open superconducting magnet apparatus of the horizontal magnetic field type. This example of the conventional superconducting magnet apparatus has been disclosed in the U.S. Pat. No. 5,410,287 and remedies the drawbacks of the aforementioned example of the conventional superconducting magnet apparatus of FIG. 7 in that the measuring space causes a subject to feel claustrophobic and in that there is the difficulty in getting access to a subject by an operator. FIG. 8(a) shows a sectional view of this example. FIG. 8(b) shows an external view thereof. As shown in FIG. 8(a), a set of three coils 23A, 24A and 25A and another set of three coils 23B, 24B and 25B are spaced apart from each other by a predetermined distance in such a manner as to be coaxial with the center axis 22 of a magnet. Further, a uniform magnetic field region 21 is generated at the halfway position between the sets of the coils. Coils of each of the sets are supported by supporting elements (not shown) and are directly cooled by a refrigerator. All of the coils of each of the sets are surrounded with thermal shields 9A and 9B that are held in vacuum enclosures 10A and 10B, respectively.

Coils 23A, 23B, 24A and 24B are main coils, through which electric currents flow in a same direction. Coils 25A and 25B are auxiliary coils, through which electric currents flow in a direction opposite to the direction of the current flow in the main coils. In the magnet having this configuration, the main coils 23A, 23B, 24A and 24B produce a magnetic field along the center axis 22. Further, the auxiliary coils 25A and 25B enhance the magnetic homogeneity of the uniform, magnetic field region 21. Incidentally, this magnet does not use shield coils. However, a room, in which the superconducting magnet apparatus is installed, is magnetically shielded.

Further, as illustrated in FIG. 8(b), the vacuum enclosures 10A and 10B facing each other in the lateral direction are shaped like doughnuts and are supported by two supporting posts 26 interposed therebetween. Thus, there is provided an open space between the vacuum enclosures 10A and 10B. A subject is inserted into the uniform magnetic field region 21 along the center axis 22, which is illustrated in FIG. 8(a), through the central bores of the vacuum enclosures 10A and 10B. Then, images of the subject are taken there.

In accordance with such a configuration, outward side surfaces of the uniform magnetic field region 21 serving as an imaging region are opened. Thus, a subject can avoid feeling claustrophobic. Moreover, an operator can easily get access to the subject from a side of the apparatus and further can use the images displayed on the screen of a monitor during an operation.

However, in the case of the superconducting magnet apparatus illustrated in FIG. 8, each of the sets of coils 23A, 24A and 25A and coils 23B, 24B and 25B and the vacuum enclosures 10A and 10B is shaped like a doughnut. Thus, a space between the doughnut-like vacuum enclosures 10A and 10B facing each other is not used as a region used for performing improvement in magnetic homogeneity. Therefore, it has been difficult to obtain favorable magnetic homogeneity over a large space. Further, magnetic fluxes generated by the superconducting coils return through the external space of the superconducting magnet apparatus, so that a leakage magnetic field becomes large. Thus, a large area is needed for installing the superconducting magnet apparatus. Alternatively, strong magnetic shielding should be performed.

FIG. 9 illustrates a third example of a conventional superconducting magnet apparatus for use in MRI system. This example is a superconducting magnet apparatus of the vertical magnetic field type. This example of the conventional superconducting magnet apparatus has been disclosed in the U.S. Pat. No. 5,194,810. This magnet enhances the magnetic homogeneity of a uniform magnetic field region 21 by generating a magnetic field by the use of two sets of superconducting coils 31 and 31, the respective sets of which are placed vertically in such a way as to face each other, and by providing iron shimming means 32 on the inner surfaces of the aforesaid superconducting coils 31 and 31 so as to obtain favorable magnetic field homogeneity. Moreover, this magnet has a structure in that upper and lower magnetic-field generating sources are mechanically supported by iron yokes 33, 33, . . . that further serve as return paths for magnetic fields generated by the upper and lower superconducting coils 31 and 31.

In the case of this example of the conventional superconducting magnet apparatus, the uniform magnetic field region 21 is opened in all directions, a subject can avoid feeling claustrophobic. Moreover, an operator can easily get access to the subject. Further, magnetic field leakage can be reduced because of the fact that the return path of the magnetic flux is composed of the aforementioned iron yokes 33, 33, . . . and upper and lower iron plates 34 and 34.

However, in the case of the superconducting magnet apparatus illustrated in FIG. 9, there are caused the problems that the iron yokes 33 and the iron plates 34 are used as above described, so that the entire magnet becomes heavy and that thus, when installing the superconducting magnet apparatus, an installation floor needs to be strengthened. Further, because the saturation magnetic flux density of iron is approximately 2 Tesla or so, there is a restraint on the magnet in that the magnetic field strength cannot be increased to a high value. Furthermore, because of the hysteresis characteristics of iron with respect to the magnetic field, a magnetic field generated by a gradient magnetic field coil affects the magnetic field distribution. This may hinder high-precision signal measurement.

As above described, there have been no conventional superconducting magnet apparatuses wherein openings, in which a subject is inserted, are enlarged so as to prevent the subject from feeling claustrophobic, wherein magnetic field leakage is low, and wherein the weight of the entire apparatus is reduced by avoiding using much iron. Moreover, in the case of the conventional apparatuses, it is difficult to realize a large uniform magnetic-field region having high-magnetic-strength.

It is, accordingly, an object of the present invention to provide a superconducting magnet apparatus that deals with such problems of the conventional superconducting magnet apparatuses, that enlarges an opening, which accommodates a subject, so as to prevent the subject from feeling claustrophobic, that has low magnetic field leakage, that avoids using much iron so as to reduce the weight thereof, and that can realize a large high magnetic field strength uniform magnetic field region.

DISCLOSURE OF INVENTION

To achieve the foregoing object of the present invention, in accordance with the present invention, there is provided a superconducting magnet apparatus comprising: magnetic field generating sources, which are made of substances having superconducting properties and are operative to feed electric current for generating a uniform magnetic field, whose direction is a first direction, in a finite region; cooling means for cooling the aforesaid magnetic field generating sources to a temperature, at which the substances exhibit the superconducting properties, and for maintaining the aforesaid magnetic field generating sources at the temperature; and supporting means for supporting the magnetic field generating sources. In this apparatus, the magnetic field generating sources are placed equidistantly in such a way as to face each other across the uniform magnetic field region along the first direction and are composed of two sets of magnetic field generating device groups for feeding electric current in a coaxial direction with the first direction being made the center axis. In this apparatus, each of the sets of magnetic field generating device groups is composed of: one or more first magnetic field generating devices for feeding electric current which flows in a second direction along the circumference of a circle, whose center axis extends in the aforesaid first direction, so as to generate a main component of the uniform magnetic field; one or more second magnetic field generating devices for feeding electric current which flows in a direction opposite to the second direction, so as to reduce a magnetic field generated outside the magnetic field generating sources; and one or more third magnetic field generating devices for feeding electric current which flows in a direction that is same as or opposite to the second direction, so as to improve magnetic homogeneity of the uniform magnetic field. The diameter of the first magnetic field generating device is nearly equal to that of the second magnetic field generating device. Further, the diameter of the third magnetic field generating device is less than that of the first magnetic field generating device. An amount of electric current fed to the third magnetic field generating device is less than an amount of electric current fed to the first magnetic field generating device. The distance between the first magnetic field generating devices facing each other across the uniform magnetic field region is shorter than that between the second magnetic field generating devices facing each other across the uniform magnetic field region.

Thereby, an apparatus, which has a large opening and small magnetic field leakage, can be realized. Further, iron is not used in order to suppress the magnetic field leakage. Thus, the weight of the apparatus can be reduced. Moreover, there is not caused a magnetic flux saturation which would be a problem caused if using iron. Therefore, even if the magnetic field strength becomes high, favorable magnetic homogeneity can be attained over the large uniform magnetic field region.

Furthermore, with the apparatus of the present invention, the diameter of the aforesaid second magnetic field generating device may be set as being larger than that of the first magnetic field generating device. Thereby, the efficiency of the second magnetic field generating device can be increased. Consequently, the magnetic field leakage to the exterior of the apparatus can be more effectively reduced.

Additionally, with the apparatus of the present invention, the second magnetic field generating devices each consists of magnetic field generating elements having a plurality of different diameters. The magnetic field generating elements are provided in such a manner that the diameter of the magnetic field generating elements corresponding to each other is increased in proportion to the distance between these magnetic field generating elements corresponding to each other and facing each other across a uniform magnetic field generating region. Thereby, the electromagnetic force acting on the second magnetic field generating elements obtained by dividing the second magnetic field generating device can be lowered. Moreover, the conditions for manufacturing the superconducting magnet apparatus can be moderated.

Besides, with the apparatus of the present invention, the first magnetic field generating devices each consists of magnetic field generating elements having a plurality of different diameters. These magnetic field generating elements are provided in such a manner that the diameter of these magnetic field generating elements corresponding to each other is increased in proportion to the distance between these magnetic field generating elements corresponding to each other and facing each other across the uniform magnetic field generating region. Thereby, the electromagnetic force acting on the first magnetic field generating elements obtained by dividing the first magnetic field generating device can be reduced.

Further, with the apparatus of the present invention, the distance between the first magnetic field generating devices facing each other across the uniform magnetic field generating region may be set as being less than the distance between the second magnetic field generating devices facing each other across the uniform magnetic field generating region and further may be set as being less than the distance between the third magnetic field generating devices facing each other across the uniform magnetic field generating region. Thereby, the magnetic field strength of the magnetic field produced in the uniform magnetic field region can be increased without increasing the magnetomotive force of the first magnetic field generating device.

Moreover, with the apparatus of the present invention, the cooling means has vacuum enclosures for containing the magnetic field generating sources. Furthermore, an outer circumferential portion of each of the vacuum enclosures protrudes to a side at which the uniform magnetic generating region exists.

In addition, with the apparatus of the present invention, each of the magnetic field generating sources is constituted by a coil obtained by winding a wire made of a substance having a superconducting property.

BEST MODE FOR CARRYING OUT THE INVENTION

Hereinafter, embodiments of the present invention will be described in detail with reference to the accompanying drawings.

Figure 1:
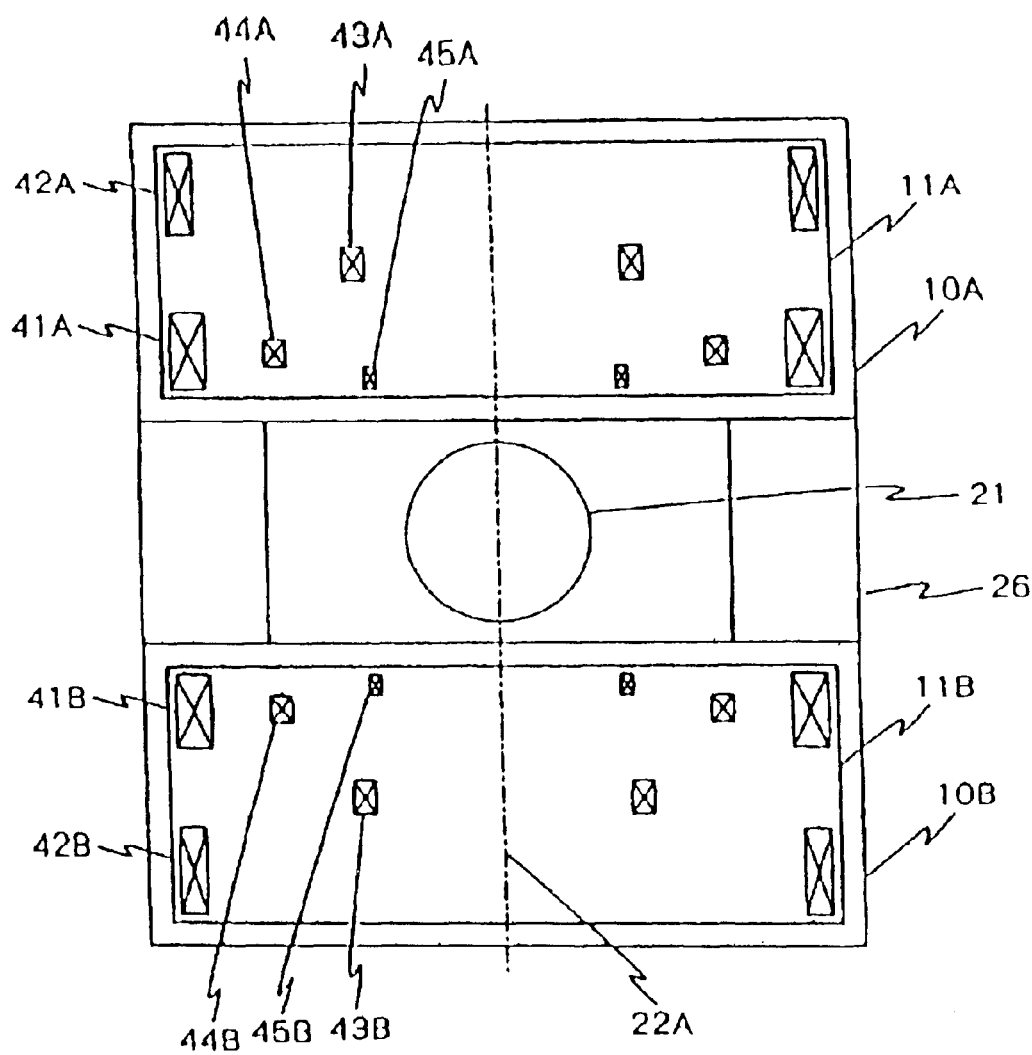
FIG. 1 is a sectional view of a first embodiment of a superconducting magnet apparatus according to the present invention.
Figure 2:
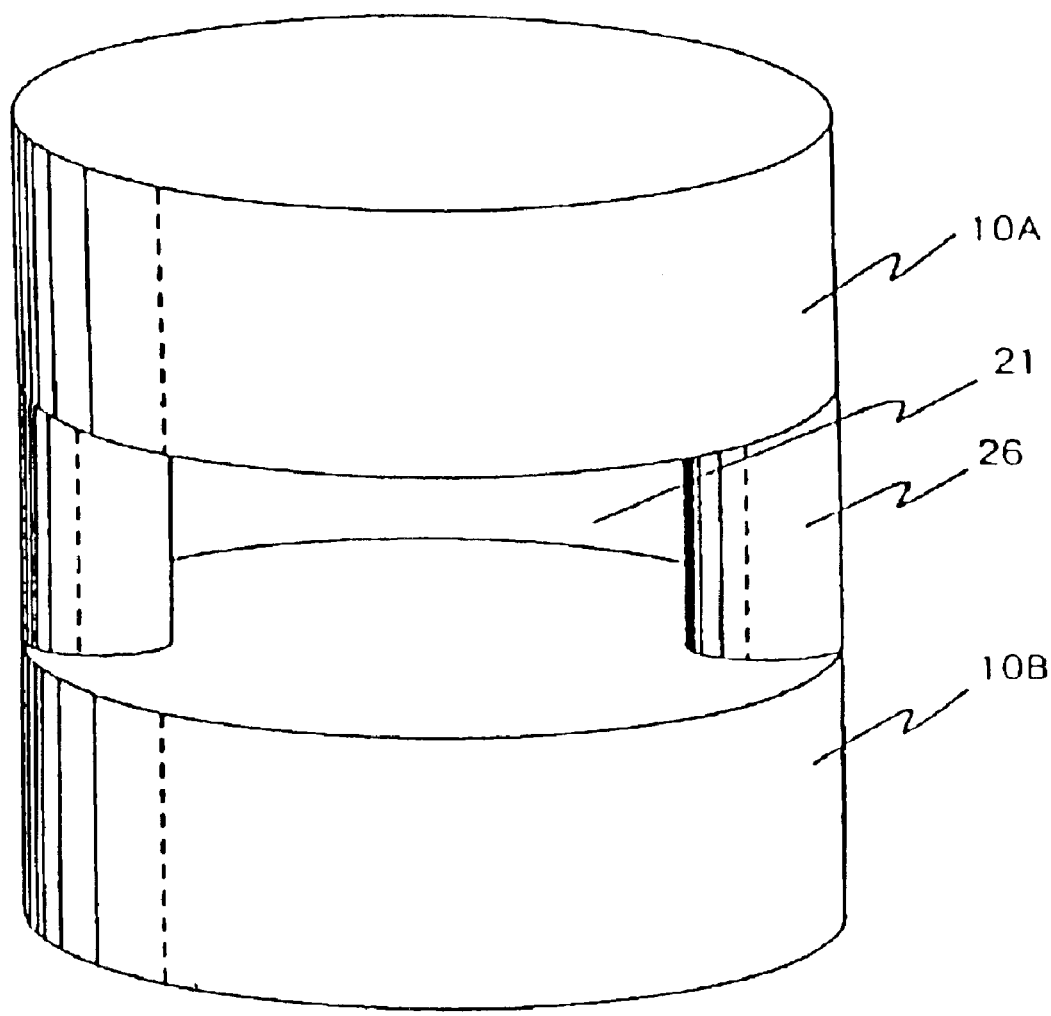
FIG. 2 is a perspective external view of the apparatus of the first embodiment.
Figure 6:
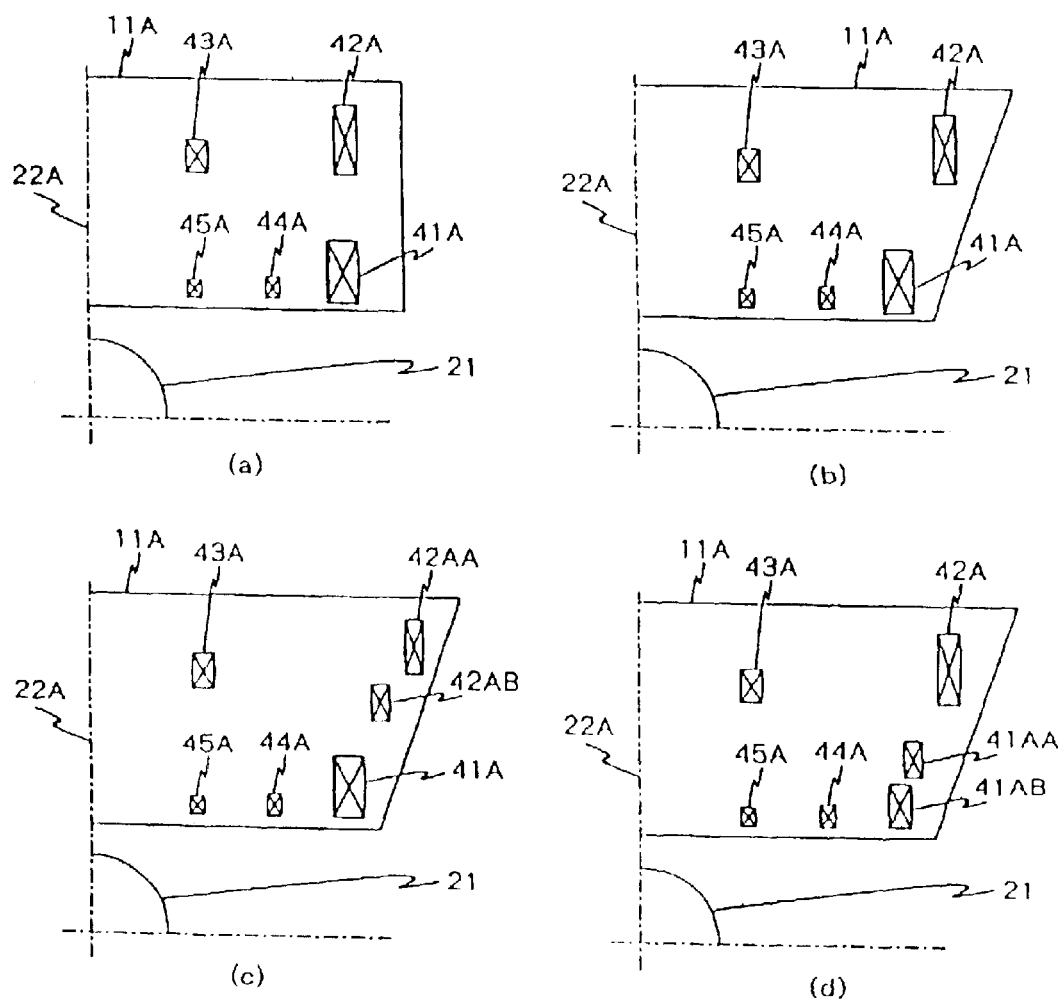
FIG. 6 is a partially sectional diagram for illustrating further other embodiments of the present invention as compared with the first embodiment of the present invention.
Figure 7:
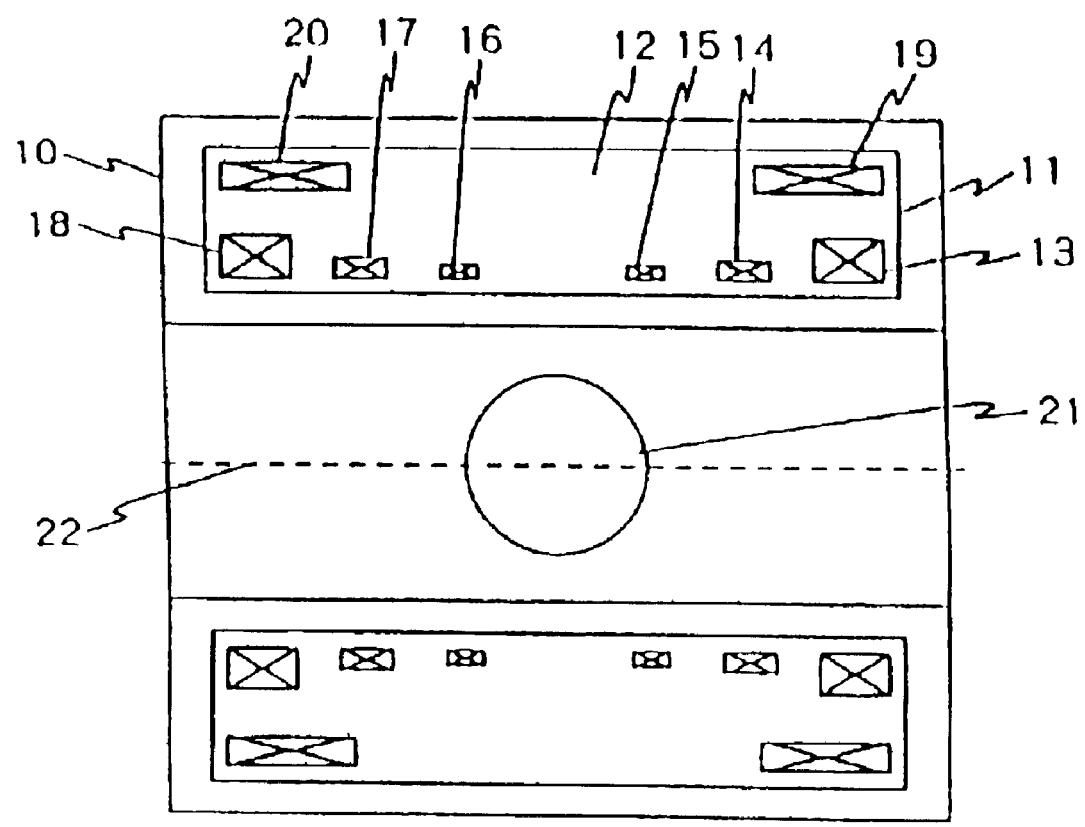
FIG. 7 is a sectional view of the superconducting magnet apparatus of the horizontal magnetic field type as an example of the conventional superconducting magnet apparatus for use in MRI system.
Figure 8:
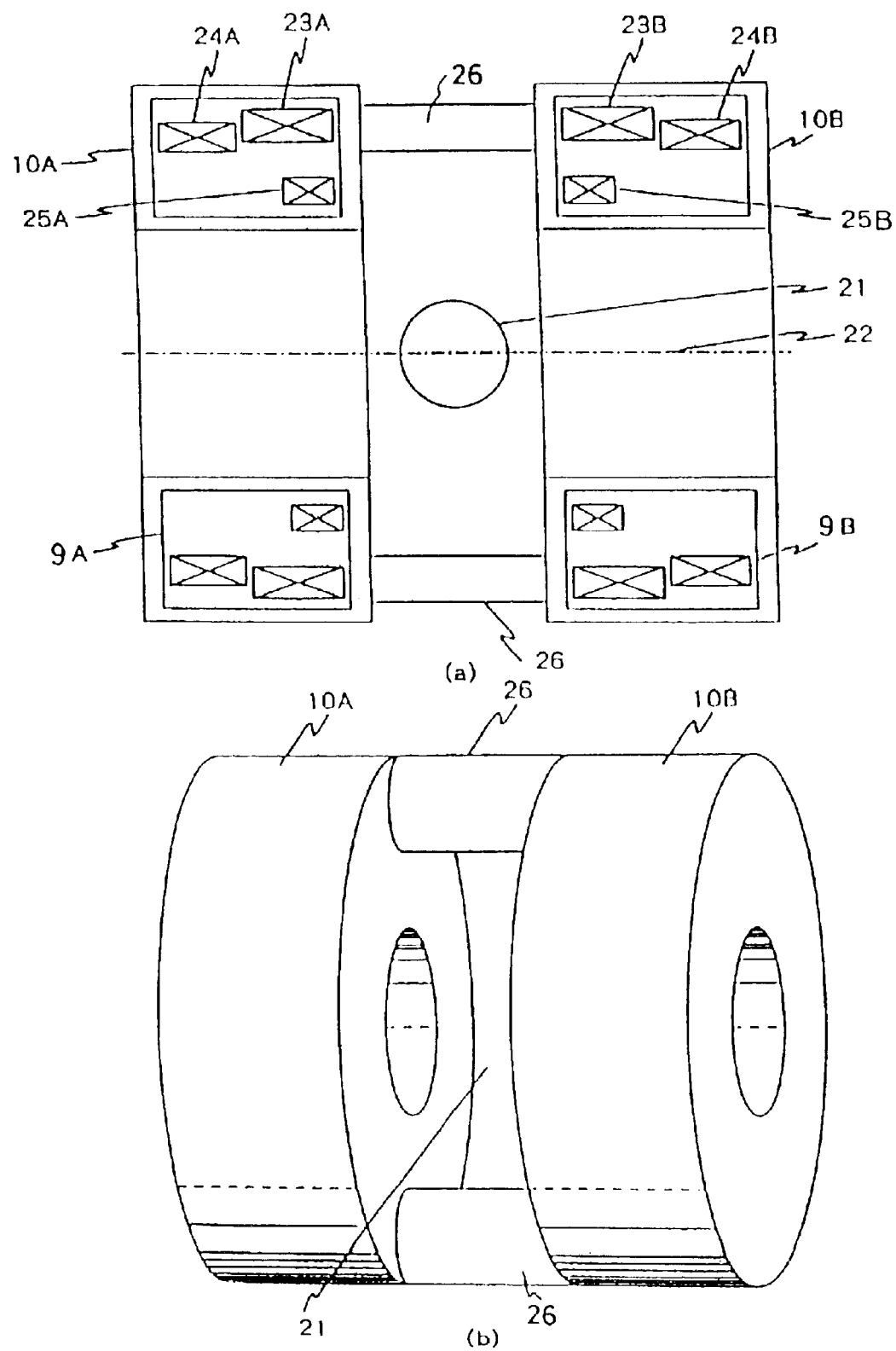
FIG. 8 shows sectional and external views of the open superconducting magnet apparatus of the horizontal magnetic field type as another example of the conventional superconducting magnet apparatus for use in MRI system.
Figure 9:
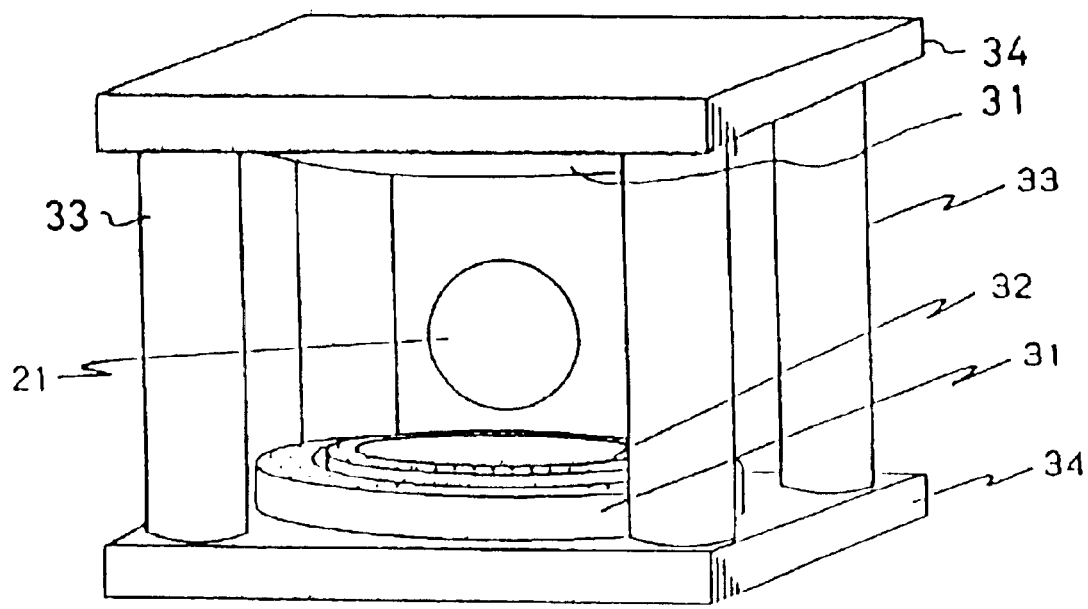
FIG. 9 is an external view of the superconducting magnet apparatus of the vertical magnetic field type as a third example of the conventional superconducting magnet apparatus for use in MRI system.

FIGS. 1, 2 and 6(*a*) illustrate a first embodiment of a superconducting magnet apparatus according to the present invention. FIG. 1 is a sectional diagram illustrating the configuration of the entire apparatus. FIG. 2 is a perspective diagram illustrating an external view of the apparatus. FIG. 6(*a*) illustrates the first embodiment of the present invention by cutting away an upper right part of the first embodiment of the present invention illustrated in the sectional diagram of FIG. 1 in such a manner as to be able to be compared with other embodiments of the present invention.

As shown in FIG. 1, cylindrical vacuum enclosures 10A and 10B containing superconducting coils are spaced apart from each other by a predetermined distance in such a manner as to be coaxial with the center axis 22A of the magnet and as to face each other vertically. The upper vacuum enclosure 10A is supported by supporting posts 26 and 26 in such a manner as to be a predetermined distance apart from the lower vacuum enclosure 10B. Coolant containers 11A and 11B, each of which is filled with coolant 12 for superconductivity, are held in the vacuum enclosures 10A and 10B. Further, superconducting coils 41A, 42A, 43A, 44A, 45A and 41B, 42B, 43B, 44B, 45B are supported by supporting elements (not shown) and are placed in the coolant containers, respectively.

As the material of each of the aforementioned superconducting coils 41A to 45A and 41B to 45B, Nb—Ti wires, which are usually frequently used as the material of superconducting coils, are employed. Further, liquid helium is used as the coolant 12 for superconductivity. Moreover, the vacuum enclosures 10A and 10B are disposed outside the coolant containers 11A and 11B, respectively, so as to prevent an occurrence of convection of heat. Moreover, thermal shields (not shown) are placed thereat to prevent an occurrence of thermal radiation.

The supporting posts 26 and 26 serve a function of mechanically supporting the upper vacuum enclosure 10A and may have a function of thermally connecting the upper and lower coolant containers 11A and 11B with each other, if necessary. Thereby, the necessity of providing a refrigerator (not shown) at each of the upper and lower coolant containers 11A and 11B is eliminated. Consequently, a single refrigerator suffices for the entire apparatus. Moreover, the number of the supporting posts 26 is not always limited to two as illustrated in the figure but may be three or four. Alternatively, a single supporting post of the cantilever type may be employed so that a subject feels free and relaxed.

In FIG. 1, five sets of superconducting coils 41A to 45A and 41B to 45B are placed in such a way as to be coaxial with the center axis 22A. Thus, a magnetic field of high magnetic homogeneity is formed in the uniform magnetic field region 21. The magnetic field is perpendicular to the longitudinal axis of the subject's body which is arranged in the magnetic field region. The functions of these superconducting coils 41A to 45A and 41B to 45B are classified into the following three kinds.

First, the superconducting coils 41A and 41B are main coils for generating a magnetic field, whose magnetic field strength is high and is not less than a predetermined level, in the uniform magnetic field region 21. Regarding the main coils, generally, there is a tendency to enhance the magnetic homogeneity of a magnetic field generated therebetween when the diameters of these coils are increased under a condition wherein the distance therebetween is maintained at a constant value. Therefore, to obtain favorable magnetic homogeneity, it is better to increase the diameters of the coils as much as possible. In contrast, as the diameter of the main coil is increased, the magnetic field strength is decreased. Thus, the magnetomotive force of the main coil needed for obtaining a magnetic field having a constant strength, is increased. This leads to an increase in price of the superconducting magnet apparatus. Further, it is preferable for lowering a feeling of oppression of a subject to decrease the outside diameter of the apparatus as much as possible. The diameters of the superconducting coils 41A and 41B acting as the main coils are determined by balancing both viewpoints with each other. Moreover, the outside diameters of the vacuum enclosures 10A and 10B are almost determined as a result of the determination of the diameter of these main coils.

Next, the superconducting coils 42A and 42B are bucking coils for canceling out an outward component of a magnetic field generated by the main coils 41A and 41B so as to suppress the magnetic field leakage to the exterior of the apparatus. These bucking coils 42A and 42B are placed in such a manner as to be coaxial with the aforementioned main coils 41A and 41B, respectively. Then, these bucking coils feed electric current, whose direction is opposite to that of electric current fed by the main coils 41A and 41B, and thus generate a magnetic field, whose direction is opposite to that of the magnetic field generated by the main coils 41A and 41B in the exterior of the apparatus. Consequently, the bucking coils cancel out the magnetic field generated outside the apparatus. It is effective for efficiently reducing the magnetic field generated outside the apparatus to increase the diameters of the bucking coils 42A and 42B as much as possible. In contrast, to prevent the magnetic field strength of the uniform magnetic field region 21 from lowering by the bucking coils 42A and 42B, it is important to move the aforesaid bucking coils 42A and 42B away from the main coils 41A and 41B as far as possible. As a result, it is preferable that as illustrated in FIG. 1 or FIG. 6(a), the bucking coils 42A and 42B have a diameter which is nearly equal to that of the main coils 41A and 41B and the distance between the two bucking coils 42A and 42B is made to be larger than that between the two main coils 41A and 41B.

Furthermore, the superconducting coils 43A, 44A, 45A and 43B, 44B, 45B are coils for correcting the magnetic homogeneity, for enhancing the magnetic homogeneity of a magnetic field generated in the uniform magnetic field region 21. These coils for correcting the magnetic homogeneity 43A to 45A and 43B to 45B are provided so as to correct an inhomogeneous component of the magnetic field generated in the uniform magnetic field region 21 formed by the aforementioned main coils 41A and 41B and the bucking coils 42A and 42B. Generally, if the main coils 41A and 41B have a sufficiently large diameter, the aforementioned inhomogeneous component of the magnetic field is not so large. Thus, the coils for correcting the magnetic homogeneity 43A to 45A and 43B to 45B do not need so large magnetomotive force as in the case of the main coils 41A and 41B and the bucking coils 42A and 42B. Furthermore, the direction of the electric current fed by the coils for correcting the magnetic homogeneity may be determined according to the inhomogeneous component of the magnetic field generated by the main coils 41A and 41B for each coil and is not limited to a specific direction. In FIG. 1, three sets of coils are placed as the coils for correcting the magnetic homogeneity. However, the number of these coils may be determined according to the inhomogeneous component of the magnetic field. Generally, as the diameter of the main coils 41A and 41B is increased, the inhomogeneous component of the magnetic field becomes smaller. Thus, the number of the coils for correcting the magnetic homogeneity can be reduced.

As a practical example of this embodiment, if the outside diameter of the main coils 41A and 41B is set as ranging from 1,600 mm to 1,800 mm, the diameter of the uniform magnetic field region 21 is set at 450 mm, and the magnetic field strength is set at 1 Tesla, then the magnetic homogeneity of 5 ppm or less is achieved in the aforementioned uniform magnetic field region 21.

According to the superconducting magnet apparatus of the present invention constructed as above described, there can be realized an apparatus which has a large opening which may be rectangular and small magnetic field leakage. Moreover, iron is not used in order to suppress the magnetic field leakage. Thus, the weight of the apparatus can be small. Moreover, there is not caused a magnetic flux saturation which would be a problem caused if using iron. Therefore, even if the magnetic field strength becomes high, favorable magnetic homogeneity can be attained over the large uniform magnetic field region 21.

Figure 3:
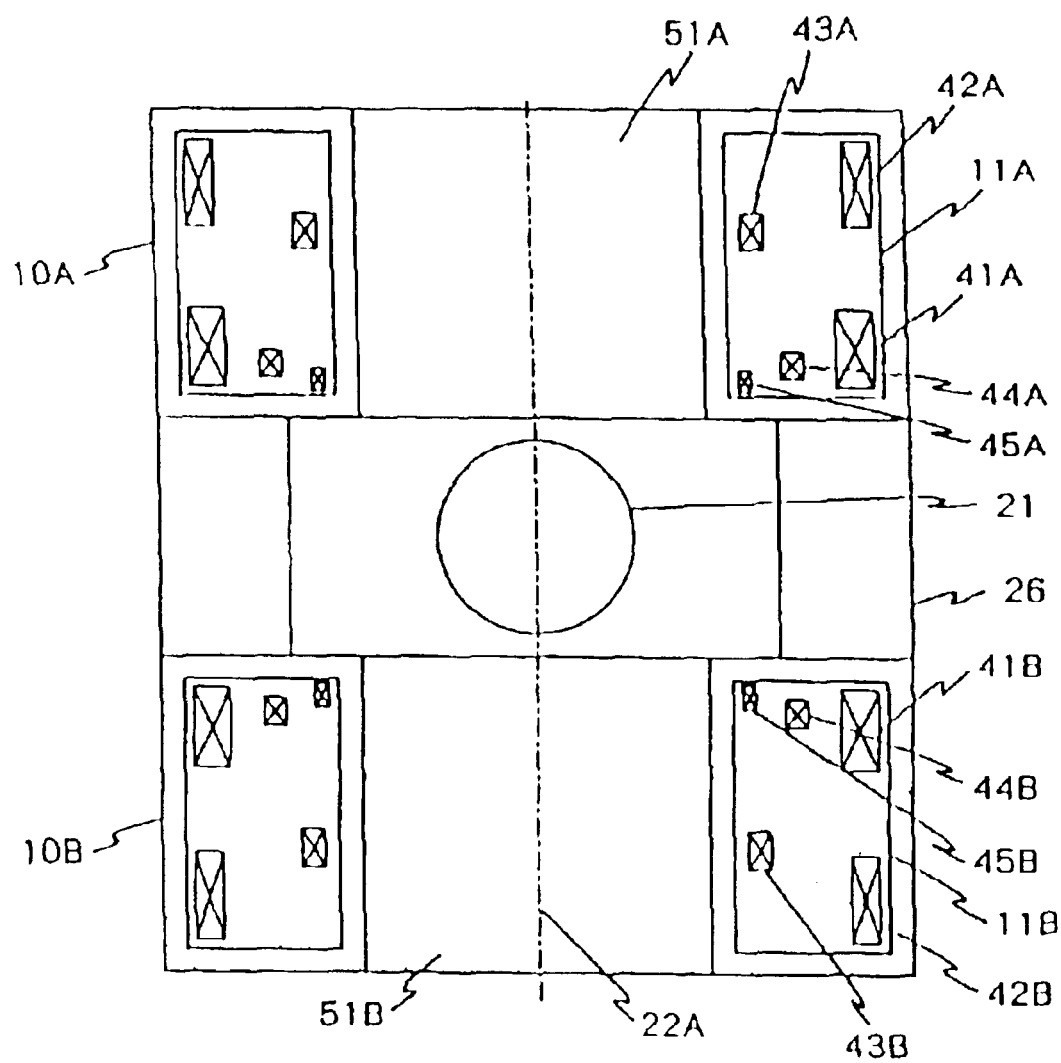
FIG. 3 is a sectional view of a second embodiment of the present invention.
Figure 4:
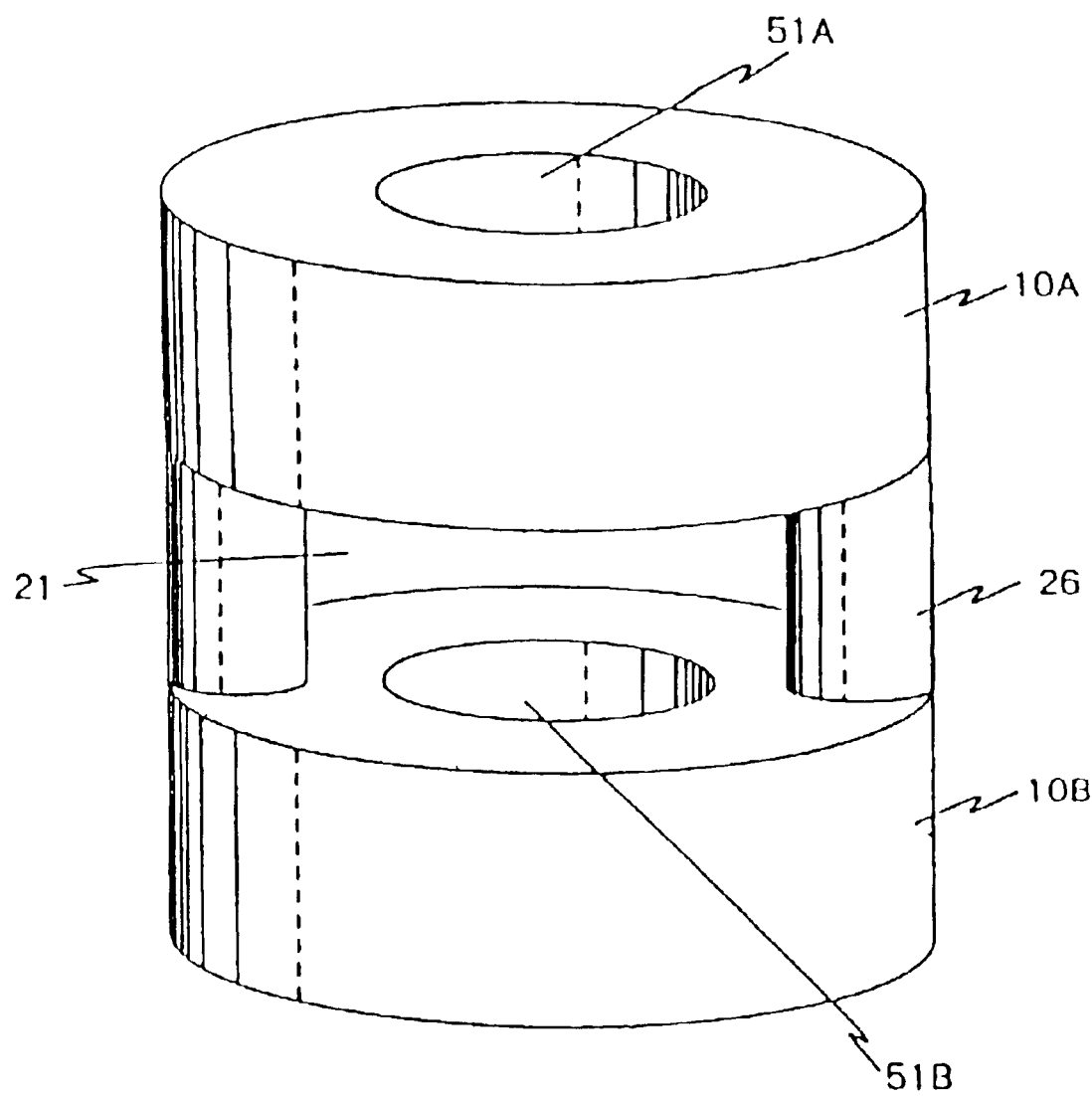
FIG. 4 is a perspective external view of the second embodiment of the present invention.

FIGS. 3 and 4 illustrate a second embodiment of the superconducting magnet apparatus according to the present invention. FIG. 3 is a sectional diagram illustrating the configuration of the entire apparatus. FIG. 4 is a perspective diagram illustrating an external view of the apparatus. As shown in FIG. 3, the vacuum enclosures 10A and 10B and the coolant containers 11A and 11B which are provided vertically are shaped like doughnuts. Further, bores are formed in the central portions 51A and 51B thereof. With such a configuration, shimming means for a gradient magnetic field and a static magnetic field may be placed in the bores formed in the aforementioned central portions 51A and 51B. Consequently, there is no need for providing a space for the shimming means between the faces of the vacuum enclosures 10A and 10B, which face each other. Thus, the opening of the apparatus can be further enlarged.

Figure 5:
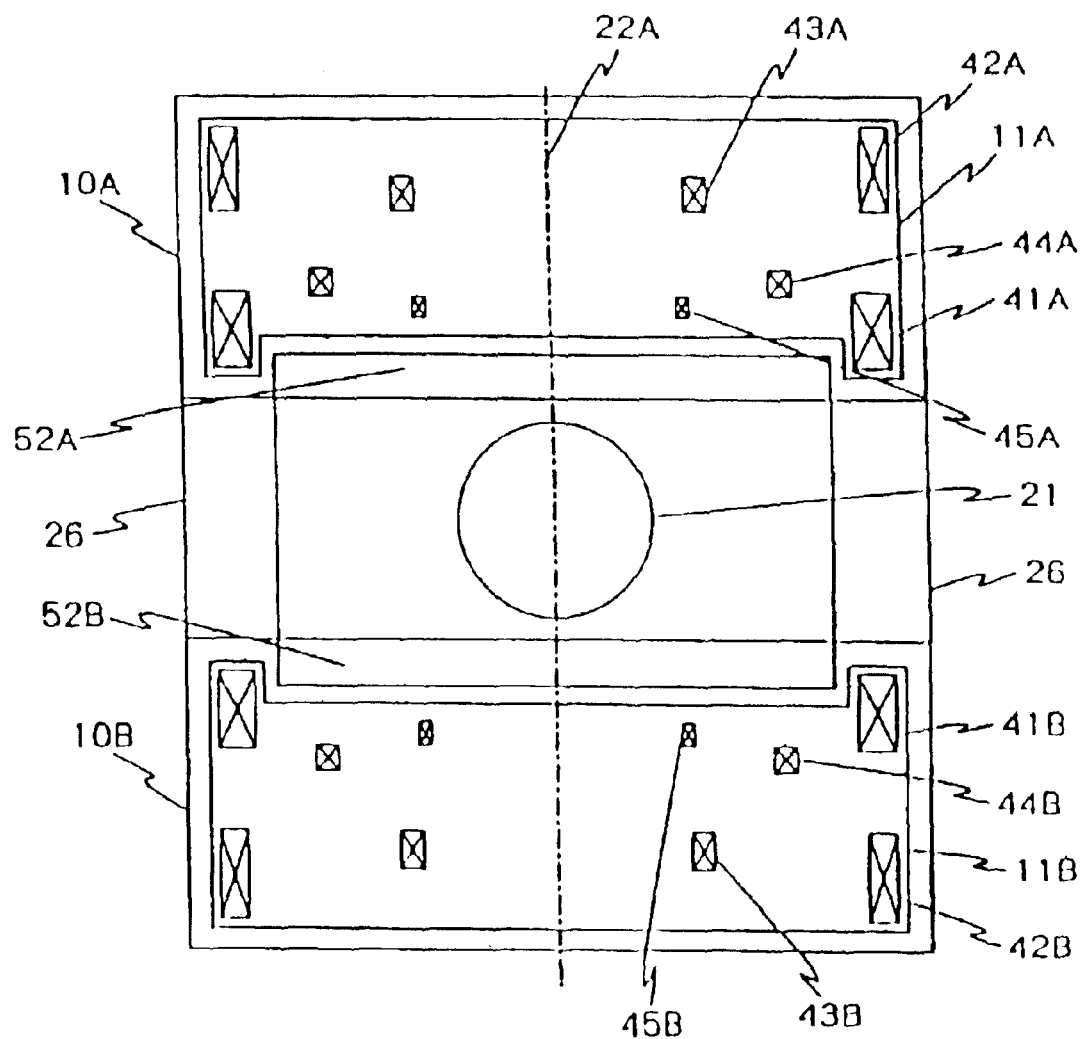
FIG. 5 is a sectional view of a third embodiment of the present invention.

FIG. 5 illustrates a third embodiment of the superconducting magnet apparatus according to the present invention. As shown in FIG. 5, the distance between the opposed main coils 41A and 41B is set as being less than that between the coils for correcting the homogeneity 43A to 45A and the corresponding shim coils 43B to 45B. With such a configuration, the magnetic field strength of the magnetic field produced in the uniform magnetic field region 21 can be increased without increasing the magnetomotive force of the main coils 41A and 41b. Furthermore, in addition to the aforementioned configuration, recess portions 52A and 52B are provided in the central portions of the faces, which face each other, of the vacuum enclosures 10A and 10B. Effective opening of the apparatus can be made to be large by accommodating a gradient magnetic field coil, a high frequency coil and magnetic field shimming means in these recess portions 52A and 52B.

Referring next to FIGS. 6(a), 6(b), 6(c) and 6(d), there are shown further other embodiments of the present invention, as compared with the first embodiment of the present invention. These embodiments are obtained by altering the placement of the main coils or the bucking coils in the first embodiment illustrated in FIG. 6(a).

First, the embodiment illustrated in FIG. 6(b) is obtained by setting the diameter of the bucking coils 42A and 42B as being larger than that of the main coils 41A and 41B. With such a configuration, the efficiency of the bucking coils 42A and 42B can be increased. Thereby, the magnetic field leakage to the exterior of the apparatus can be more effectively reduced. In this case, only the diameter of the bucking coils is increased, so that the field of view of a subject is substantially undamaged when the subject enters the opening of the apparatus. Consequently, the subject feels claustrophobic in the same degree as in the case of the embodiment of FIG. 6(a).

Next, the embodiment illustrated in FIG. 6(c) is the case realized by dividing the bucking coils 42A and 42B of FIG. 6(a) into a set of two bucking coils 42AA and 42AB and another set of two bucking coils 42BA and 42BB, respectively. Generally, each coil is placed in a magnetic field generated by itself, and electric current flows therethrough. Thus, an electromagnetic force is exerted on each coil. This electromagnetic force, which depends on the magnetic field strength of the uniform magnetic field region 21, may reach the strength of 100 t or so. Therefore, it is an important problem how to reduce this electromagnetic force when manufacturing a superconducting magnet apparatus. Thus, the magnetic force exerted onto each coil can be decreased by dividing the bucking coils 42A and 42B, onto which especially large magnetic forces are acted, into a set of two bucking coils 42AA and 42AB and another set of two bucking coils 42BA and 42BB, respectively, as illustrated in FIG. 6(c). Consequently, the conditions for manufacturing superconducting magnet apparatuses can be moderated. Furthermore, in the case of this embodiment, each of the bucking coils is divided into two coils. However, the present invention is not limited thereto. Namely, each of the bucking coils may be divided into three or more coils.

Furthermore, the embodiment illustrated in FIG. 6(d) is the case realized by dividing the main coils 41A and 41B of FIG. 6(a) into a set of two main coils 41AA and 41AB and another set of two main coils 41BA and 41BB, respectively. In this case, the magnetic force exerted onto each resultant main coil can be decreased by dividing the main coils 41A and 41B into a set of two main coils and another set of two main coils, respectively. Further, in the case of this embodiment, the number of resultant main coils obtained by the division is not limited to two. Namely, each of the main coils may be divided into three or more main coils.

Incidentally, in the foregoing description, coolants for superconductivity, such as liquid helium, are used as the cooling means for cooling superconductive materials. In the case that oxide superconductors are used as the superconductive materials, the material may be cooled by liquid nitrogen. Alternatively, the material may be cooled directly by a refrigerator, so that the apparatus sometimes does without using the coolant containers.

INDUSTRIAL APPLICABILITY

As above described, according to the present invention, an opening, which accommodates a subject, of a superconducting magnet apparatus is enlarged to thereby prevent the subject from feeling claustrophobic. Further, an operator can easily get access to the subject. Moreover, there can be provided a superconducting magnet apparatus, whose magnetic field leakage is low and weight thereof is light, which can realize a large uniform magnetic field region even in the case of high magnetic field strength. Consequently, conditions for installing a superconducting magnet apparatus are moderated. Moreover, favorable pictures can be taken.

What we claimed is:

1. A magnetic resonance imaging apparatus comprising:

a pair of magnetic field generating means for generating a magnetic field in a first direction to form a desired uniform magnetic field space, said magnetic field generating means being formed in a doughnut-shape at a predetermined interval across said magnetic field space in a direction perpendicular to said first direction, each of said magnetic field generating means including a vacuum enclosure, cooling means and a group of magnetic field generating devices;

said cooling means being arranged within said vacuum enclosure for containing and cooling said group of magnetic field generating devices; and supporting means for supporting said magnetic field generating means;

each of said magnetic field generating devices including a first magnetic field generating device for generating a main component of said uniform magnetic field, a second magnetic field generating device for reducing a magnetic field generated outside said magnetic field generating means and a third magnetic field generating device for improving magnetic homogeneity of said uniform magnetic field, said first magnetic field generating device having a predetermined outer diameter greater than that of said third magnetic field generating device, and said second magnetic field generating device having an outer diameter at least equal to that of said first magnetic field generating device; and said first magnetic field generating device being arranged within said second magnetic field generating device relative to a direction of the magnetic field for forming said uniform magnetic field space at the center.

2. A magnetic resonance imaging apparatus according to claim 1, wherein each of said magnetic field generating means has a through-bore parallel to said first direction in a central portion thereof, whereby each of said magnetic field generating means is shaped like a doughnut.

3. A magnetic resonance imaging apparatus according to claim 1, wherein said third magnetic field generating device is arranged within said first and second magnetic field generating devices relative to a through-bore in a central portion of each of said magnetic field generating means.

* * * * *